(12) United States Patent
Yu

(10) Patent No.: US 6,297,536 B2
(45) Date of Patent: *Oct. 2, 2001

(54) DIODE STRUCTURE COMPATIBLE WITH SILICIDE PROCESSES FOR ESD PROTECTION

(75) Inventor: Ta-Lee Yu, Hsinchu Hsien (TW)

(73) Assignee: Winbond Electronics Corp., Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/270,830

(22) Filed: Mar. 18, 1999

(30) Foreign Application Priority Data

Nov. 30, 1998 (TW) .................................................. 87119832

(51) Int. Cl.[7] ..................................................... H01L 33/00
(52) U.S. Cl. ............................................ 257/365; 257/366
(58) Field of Search ..................................... 257/365, 366

(56) References Cited

U.S. PATENT DOCUMENTS

| 3,246,177 | * | 4/1966 | Schroeder . |
| 3,339,086 | * | 8/1967 | Shockley . |
| 3,803,461 | * | 4/1974 | Beneking . |
| 5,663,587 | * | 9/1997 | Miyazaki . |
| 5,693,550 | * | 12/1997 | Torii . |

* cited by examiner

Primary Examiner—Stephen D. Meier
(74) Attorney, Agent, or Firm—Nath & Associates PLLC; Harold L. Novick

(57) ABSTRACT

A diode structure compatible with silicide processes for electrostatic discharge protection is disclosed. The diode structure comprises a semiconductor layer of a first conductivity type, a diffusion region of a second conductivity type formed in the semiconductor layer, and a doped region of the second conductivity type formed in the semiconductor layer around the diffusion region. The doped region has a doping concentration less than that of the diffusion region to provide a ballastic resistance under a high current stressing condition.

19 Claims, 3 Drawing Sheets

DIODE STRUCTURE COMPATIBLE WITH SILICIDE PROCESSES FOR ESD PROTECTION

BACKGROUND OF THE INVENTION

1. Field of the Invention

The present invention generally relates to electrostatic discharge protection for semiconductor integrated circuitry. More particularly, the present invention relates to an improved diode structure compatible with silicide processes for electrostatic discharge protection.

2. Description of the Related Art

In sub-micron MOS-based technology, electrostatic discharge, ESD hereinafter, becomes a reliability concern. As shown in FIG. 1, a part of diodes D1 and D2 are provided at the pad 1 of a conventional integrated circuit. When ESD occurs at the pad 1, the diode D1 or D2 enters breakdown to bypass the ESD stress so as to protect the internal circuit 2 from ESD damage.

Referring to FIG. 2, the diode D1 or D2 of FIG. 1 disposed on semiconductor substrate 20 is illustrated in a cross-sectional view. In FIG. 2, an insulator 21, such as field oxide grown by means of local oxidation, are provided on the P-type semiconductor substrate 20. An N-type diffusion region 22 is formed in the semiconductor substrate 20 and encircled by the insulator 21. Therefore, diodes D1 or D2 are constituted by the P/N junction between the N-type diffusion region 22 and the P-type substrate 20. In addition, a silicide layer 23 can be formed over the N-type diffusion region 22 by a so-called self-aligned silicidation (salicide) process to reduce the contact sheet resistance.

However, under high current stressing conditions the ballastic resistance is dramatically reduced. Hence, once the hot spot is initiated at the diffusion edge 24, there is very little resistance to prevent current localization through the hot spot. Therefore, when the temperature at the silicide reaches up to 1000° C., the silicide can begin to decompose or interact with the silicon, or both, and cause damage to the diode D1 or D2.

SUMMARY OF THE INVENTION

Therefore, it is an object of the present invention to provide a diode structure compatible with the silicide process without additional process steps.

The above object can be realized by providing a diode structure comprising: a semiconductor layer of a first conductivity type, a diffusion region of a second conductivity type formed in the semiconductor layer, and a doped region of the second conductivity type formed in the semiconductor layer around the diffusion region. The doped region has a doping concentration less than the diffusion region to provide a ballastic resistance under a high current stressing condition.

Accordingly, during an ESD event a discharge current can flow through the silicide layer as well as the diffusion junction, and then pass through the P/N junction between the diffusion region and the substrate uniformly. Therefore, the discharge current is prevented from localization through the diffusion edge so as to protect the diode from ESD damage.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

First Embodiment

Figure 1:
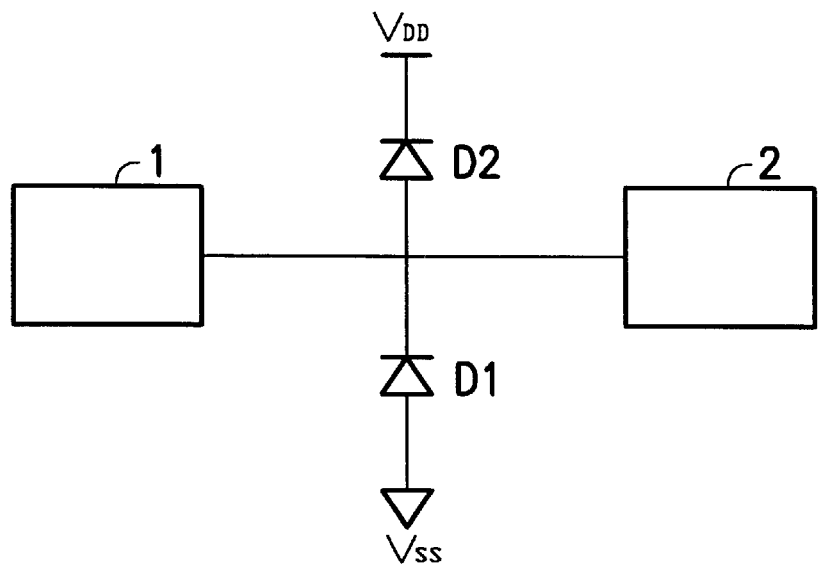
FIG. 1 depicts the circuit diagram of a conventional diode-based ESD protection circuit.
Figure 2:
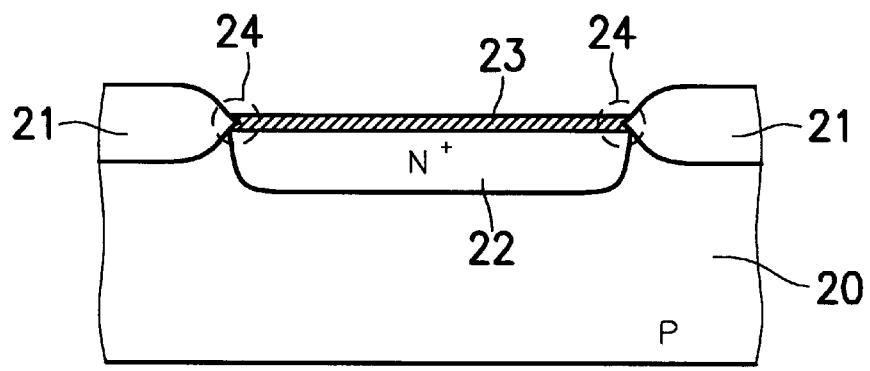
FIG. 2 depicts the diode of FIG. 1 disposed on a semiconductor substrate in a cross-sectional view.
Figure 3:
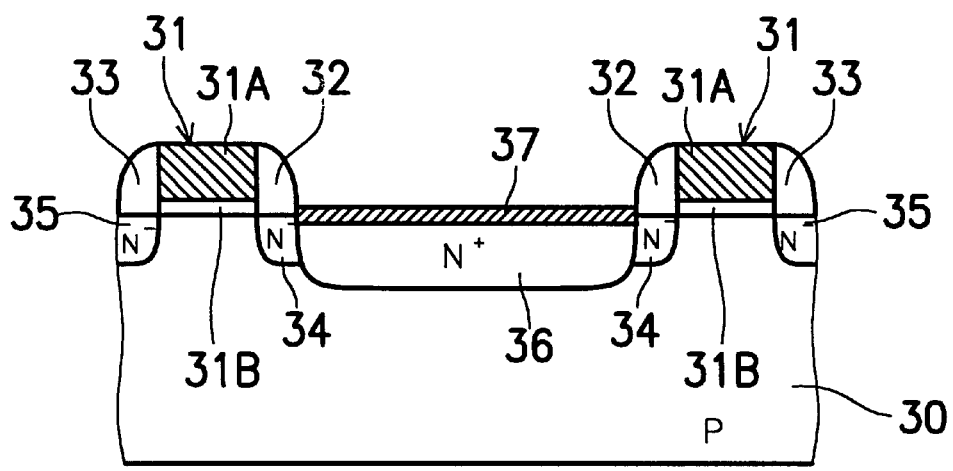
FIG. 3 depicts one preferred embodiment in accordance with the present invention disposed on a semiconductor substrate in a cross-sectional view.
Figure 4:
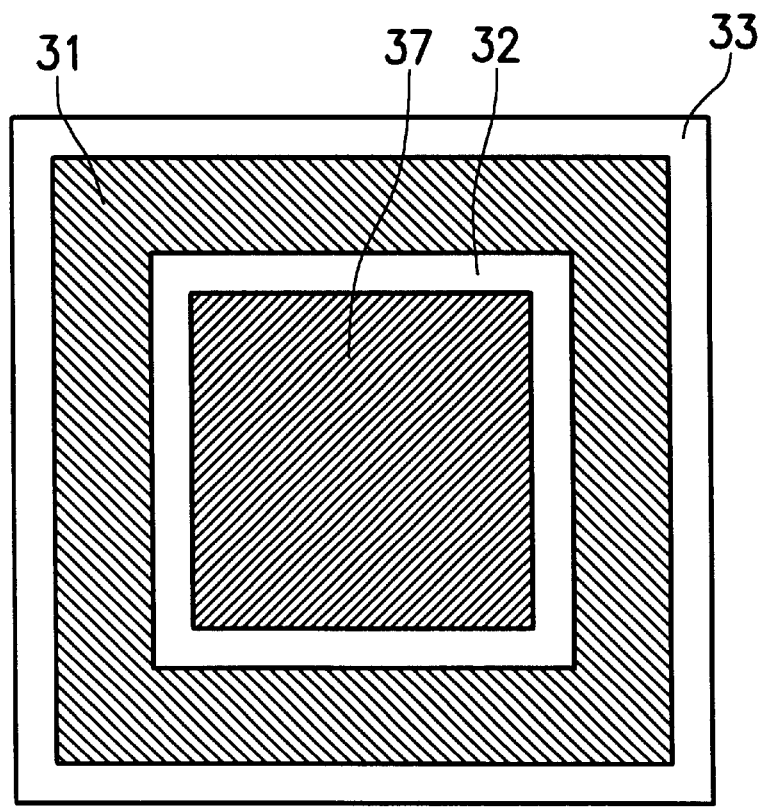
FIG. 4 depicts the top view of FIG. 3.

Referring to FIGS. 3 and 4, the cross-sectional view and top view of a diode structure disposed on a semiconductor substrate in accordance with one preferred embodiment of the present invention are illustrated, respectively. In the drawing, reference numeral 30 designates a P-type semiconductor substrate or a P-well formed in a semiconductor substrate, commonly termed a "P-type semiconductor layer".

In this case, a ring-shaped gate structure 31 is formed on the P-type semiconductor layer 30. From top to bottom the gate structure 31 includes a gate electrode layer 31A and a gate dielectric layer 31B. An inner sidewall spacer 32 is formed on the inner sidewall of the gate structure 31 and an outer sidewall spacer 33 is formed on the outer sidewall thereof. N-type lightly-doped regions 34 and 35 are formed in the semiconductor layer 30 beneath the inner spacer 32 and outer spacer 33, respectively. An N-type heavily-doped diffusion region 36 is formed in the P-type semiconductor layer 30 within the range encircled by the gate structure 31. Preferably, the diffusion edge is encircled by the N-type lightly-doped region 34 having a doping concentration and a junction depth less than those of the N-type diffusion region 36. Moreover, a silicide layer 37 is formed over the N-type diffusion region 36 so as to reduce the contact sheet resistance.

As shown in FIGS. 3 and 4, the whole edge of the diffusion region 36 is encompassed by the N-type lightly-doped region 34 to increase the ballastic resistance of the diode under high current stressing conditions. Therefore, during an ESD event a discharge current can flow through the silicide layer 37 as well as the N-type diffusion region 36, and then pass through the junction between the N-type diffusion region 36 and the P-type semiconductor layer 30 uniformly. Accordingly, the diode structure of the present invention prevents the diffusion edge from current localization and thus protects the diode contact from ESD damage.

Furthermore, the diode structure of the present invention is compatible with the self-aligned silicidation and lightly-doped drain (LDD) processes applied to the internal circuit. Thus, effective ESD protection can be provided without additional processing steps. In addition, though the N-type and P-type are exemplified in FIGS. 3 and 4, the fact that the N-type and P-type are interchangeable is apparent to those skilled in the art.

Second Embodiment

Figure 5:
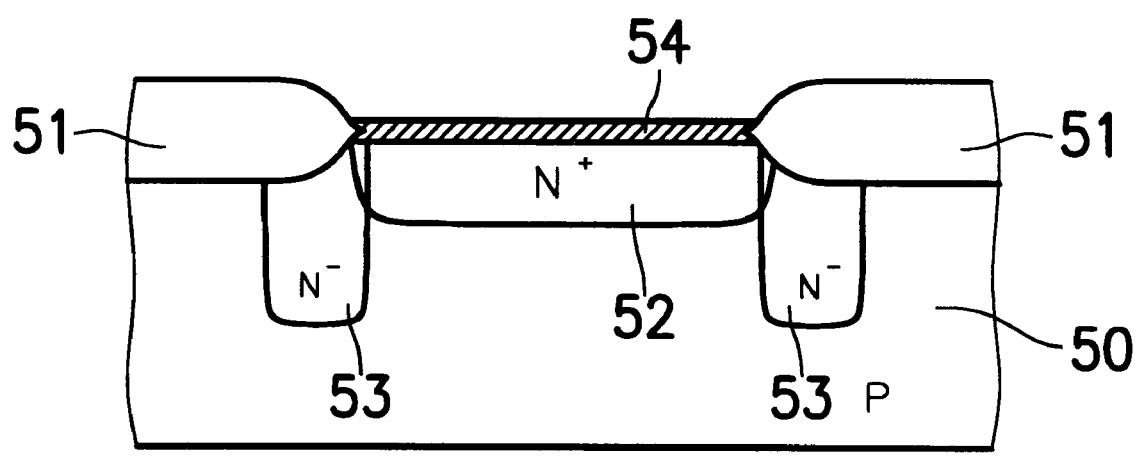
FIG. 5 depicts another preferred embodiment in accordance with the present invention disposed on a semiconductor substrate in a cross-sectional view.

Referring to FIG. 5, the cross-sectional view of a diode structure disposed on a semiconductor substrate in accordance with another preferred embodiment of the present invention is illustrated. In the drawing, reference numeral 50 designates a P-type semiconductor substrate or a P-well formed in a semiconductor substrate, commonly termed a "P-type semiconductor layer".

In this embodiment, a ring-shaped insulative structure 51 is formed on the P-type semiconductor layer 50. For example, the insulative structure 51 is field oxide formed by local oxidation of silicon (LOCOS) procedure. An N-type heavily-doped diffusion region 52 is formed in the P-type semiconductor layer 50 within the range encircled by the insulative structure 51. In addition, the diffusion edge is encircled by an N-well region 53 having a doping concentration less than that of the N-type diffusion region 52 and a junction depth greater than that of the N-type diffusion region 36. Moreover, a silicide layer 54 is formed over the N-type diffusion region 52 so as to reduce the contact sheet resistance.

As shown in FIG. 5, the whole edge of the diffusion region 52 is encompassed by the N-well 53 to increase the ballastic resistance of the diode under high current stressing conditions. Therefore, during an ESD event a discharge current can flow through the silicide layer 54 as well as the N-type diffusion region 52, and then pass through the junction between the N-type diffusion region 52 and the P-type semiconductor layer 50 uniformly. Accordingly, the diode structure of the present invention prevents the diffusion edge from current localization and thus protects the diode contact from ESD damage.

Furthermore, the diode structure of the present invention is compatible with the self-aligned silicidation and lightly-doped drain (LDD) processes applied to the internal circuit. Thus, effective ESD protection can be provided without additional processing steps. In addition, though the N-type and P-type are exemplified in FIG. 5, the fact that the N-type and P-type are interchangeable is apparent to those skilled in the art.

In summary, the diode structure of the present invention is provided with a light-doped region or well region encircling the diffusion edge to increase the ballastic resistance under high current stressing conditions. During an ESD event a discharge current can flow through the silicide layer as well as the diffusion junction, and then pass through the P/N junction between the diffusion region and the substrate uniformly. Accordingly, the discharge current is prevented from localization through the diffusion edge to protect the diode from ESD damage.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A diode structure for electrostatic discharge protection, comprising:
    a semiconductor layer of a first conductivity type, directly coupled to a first pad;
    a diffusion region of a second conductivity type formed in said semiconductor layer, directly coupled to a second pad;
    a silicide layer overlying said diffusion region; and
    a doped region of the second conductivity type formed in said semiconductor layer around the edge of said diffusion region, wherein said doped region has a doping concentration less than that of said diffusion region to provide a ballastic resistance between the first pad and the second pad under a high current stressing condition.

2. The diode structure as claimed in claim 1, further comprising a gate ring formed on said semiconductor layer around said diffusion region.

3. The diode structure as claimed in claim 2, further comprising a spacer formed on the inner sidewall of said gate ring.

4. The diode structure as claimed in claim 3, wherein said doped region has a junction depth less than that of said diffusion region.

5. The diode structure as claimed in claim 1, wherein said doped region is a well region.

6. The diode structure as claimed in claim 5, wherein said doped region has a junction depth greater than that of said diffusion region.

7. The diode structure as claimed in claim 1, wherein the first conductivity type is P-type and the second conductivity type is N-type.

8. The diode structure as claimed in claim 1, wherein the first conductivity type is N-type and the second conductivity type is P-type.

9. The diode structure as claimed in claim 1, wherein the diffusion region is encircled by a field oxide ring.

10. A diode structure for electrostatic discharge protection, comprising:
    a semiconductor layer of a first conductivity type;
    a diffusion region of a second conductivity type formed in said semiconductor layer and directly coupled to a first pad;
    a silicide layer overlying said diffusion region;
    a gate ring formed on said semiconductor layer around said diffusion region and directly coupled to a second pad; and
    a doped region of the second conductivity type formed in said semiconductor layer around the edge of said diffusion region, wherein said doped region has a doping concentration less than that of said diffusion region to provide a ballastic resistance between the first pad and the second pad under a high current stressing condition.

11. The diode structure as claimed in claim 10, further comprising a spacer formed on the inner sidewall of said gate ring.

12. The diode structure as claimed in claim 11, wherein said doped region has a junction depth less than that of said diffusion region.

13. The diode structure as claimed in claim 10, wherein the first conductivity type is P-type and the second conductivity type is N-type.

14. The diode structure as claimed in claim 10, wherein the first conductivity type is N-type and the second conductivity type is P-type.

15. A diode structure for electrostatic discharge protection, comprising:
    a semiconductor layer of a first conductivity type;
    a diffusion region of a second conductivity type formed in said semiconductor layer;
    a silicide layer overlying said diffusion region; and
    a well region of the second conductivity type formed in said semiconductor layer around the edge of said diffusion region, wherein said well region has a doping concentration less than that of said diffusion region to provide a ballastic resistance under a high current stressing condition.

16. The diode structure as claimed in claim 15, wherein said well region has a junction depth greater than that of said diffusion region.

17. The diode structure as claimed in claim 15, wherein the first conductivity type is P-type and the second conductivity type is N-type.

18. The diode structure as claimed in claim 15, wherein the first conductivity type is N-type and the second conductivity type is P-type.

19. The diode structure as claimed in claim 15, further comprising a field oxide ring formed on said semiconductor layer around said diffusion region.

* * * * *